United States Patent
Ma et al.

(10) Patent No.: US 12,087,851 B2
(45) Date of Patent: Sep. 10, 2024

(54) SEMICONDUCTOR DEVICE STRUCTURES AND METHODS OF MANUFACTURING THE SAME

(71) Applicant: INNOSCIENCE (SUZHOU) SEMICONDUCTOR CO., LTD., Suzhou (CN)

(72) Inventors: Junhui Ma, Zhuhai (CN); Yulong Zhang, Zhuhai (CN); Ming-Hong Chang, Zhuhai (CN)

(73) Assignee: INNOSCIENCE (SUZHOU) SEMICONDUCTOR CO., LTD., Suzhou (CN)

( * ) Notice: Subject to any disclaimer, the term of this patent is extended or adjusted under 35 U.S.C. 154(b) by 839 days.

(21) Appl. No.: 17/254,833

(22) PCT Filed: Dec. 2, 2020

(86) PCT No.: PCT/CN2020/133291
§ 371 (c)(1),
(2) Date: Dec. 21, 2020

(87) PCT Pub. No.: WO2022/116036
PCT Pub. Date: Jun. 9, 2022

(65) Prior Publication Data
US 2022/0376097 A1 Nov. 24, 2022

(51) Int. Cl.
*H01L 29/778* (2006.01)
*H01L 29/20* (2006.01)
*H01L 29/66* (2006.01)

(52) U.S. Cl.
CPC ...... *H01L 29/7786* (2013.01); *H01L 29/2003* (2013.01); *H01L 29/66462* (2013.01)

(58) Field of Classification Search
CPC ............ H01L 23/3192; H01L 23/3171; H01L 29/2003; H01L 29/66462; H01L 29/7786;
(Continued)

(56) References Cited

U.S. PATENT DOCUMENTS 10,249,506 B2    4/2019  Macelwee et al.
2011/0316048 A1* 12/2011 Ikeda .................. H01L 29/7786
                                                 257/192
(Continued)

FOREIGN PATENT DOCUMENTS

CN       109103098 A    12/2018
DE   102012202351 A1     8/2012

OTHER PUBLICATIONS

First Office Action of the corresponding China patent application No. 202080005211.8 mailed on May 25, 2022.
(Continued)

*Primary Examiner* — Mouloucoulaye Inoussa
(74) *Attorney, Agent, or Firm* — JCIPRNET

(57) ABSTRACT

Semiconductor device structures and methods for manufacturing the same are provided. The semiconductor device structure includes a substrate, a first nitride semiconductor layer, a second nitride semiconductor layer, a first dielectric layer and a second dielectric layer. The first nitride semiconductor layer is disposed on the substrate. The second nitride semiconductor layer is disposed on the first nitride semiconductor layer and has a bandgap greater than that of the first nitride semiconductor layer. The first dielectric layer is disposed on the second nitride semiconductor layer. The second dielectric layer is disposed on the first dielectric layer. The second dielectric layer includes a first portion and a second portion separated from the first portion by a trench, wherein the trench terminates at an upper surface of the first dielectric layer.

18 Claims, 20 Drawing Sheets

(58) Field of Classification Search
CPC ............... H01L 21/561; H01L 29/1066; H01L
23/3178; H01L 29/7787; H01L 21/78;
H01L 23/3185; H01L 29/0657; H01L
21/32139; H01L 23/585; H01L 23/562;
H01L 24/00; H01L 21/02507; H01L
21/30612; H01L 29/778; H01L 27/0605;
H01L 29/205; H01L 21/8252; H01L
27/085; H01L 29/7783; H01L 29/41766;
H01L 29/861; H01L 29/1075; H01L
29/207; H01L 29/06; H01L 29/786; H01L
29/402; H01L 29/518; H01L 29/4236;
H01L 24/05; H01L 23/5226; H01L
23/528; H01L 24/03; H01L 24/02; H01L
23/31; H01L 23/50; H01L 23/291; H01L
23/293; H01L 23/564; H01L 23/3114;
H01L 2224/05554; H01L 2224/05647;
H01L 2224/05567; H01L 2224/03831;
H01L 2224/05147; H01L 2224/05025;
H01L 2224/06155; H01L 2224/05124;
H01L 2924/1033; H01L 2224/0391;
H01L 2224/05624; H01L 2924/013;
H01L 2924/01013; H01L 2924/00014;
H01L 2924/01029; G03F 7/2022; C01B
21/0632; C01G 15/00

USPC ............ 257/192, 194, 43, 76, 639, E29.246,
257/E29.081, E29.091; 438/270, 104,
438/285, 172, 517
See application file for complete search history.

(56) References Cited

U.S. PATENT DOCUMENTS

| | | |
|---|---|---|
| 2012/0220103 A1 | 8/2012 | Yamada et al. |
| 2016/0204074 A1 | 7/2016 | Lin et al. |
| 2017/0256638 A1 | 9/2017 | Macelwee et al. |
| 2018/0012770 A1 | 1/2018 | Macelwee et al. |
| 2018/0166498 A1* | 6/2018 | Sung ..................... H01L 27/156 |
| 2019/0019770 A1* | 1/2019 | Chang ................. H01L 23/3171 |
| 2020/0251586 A1* | 8/2020 | Otake ............... H01L 29/66219 |
| 2022/0122885 A1* | 4/2022 | Du ......................... H01L 23/544 |
| 2022/0302296 A1* | 9/2022 | Zhang ................. H01L 29/0657 |

OTHER PUBLICATIONS

International Search Report and Written Opinion of the corresponding PCT application No. PCT/CN2020/133291 mailed on Aug. 26, 2021.

* cited by examiner

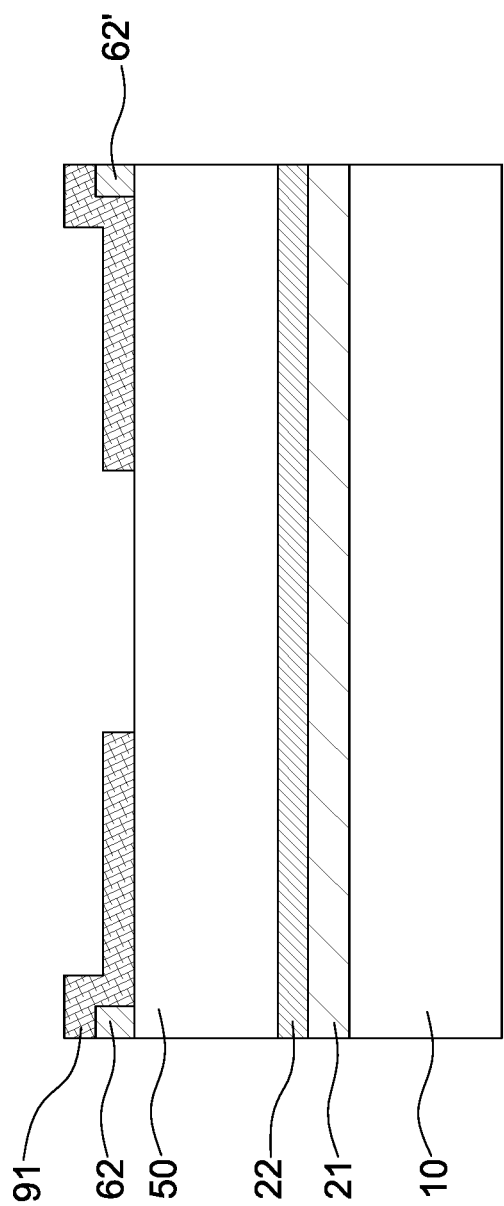

SEMICONDUCTOR DEVICE STRUCTURES AND METHODS OF MANUFACTURING THE SAME

BACKGROUND

1. Field of the Disclosure

The present disclosure relates to a semiconductor device structure and a method for manufacturing the same.

2. Description of Related Art

Components including direct bandgap semiconductors, such as, for example, semiconductor components including group III-V materials or group III-V compounds (Category: III-V compounds) can operate or work under a variety of conditions or in a variety of environments (e.g., at different voltages and frequencies).

The semiconductor components may include a heterojunction bipolar transistor (HBT), a heterojunction field effect transistor (HFET), a high-electron-mobility transistor (HEMT), a modulation-doped FET (MODFET) and the like.

SUMMARY

According to some embodiments of the present disclosure, a semiconductor device structure includes a substrate, a first nitride semiconductor layer, a second nitride semiconductor layer, a first dielectric layer and a second dielectric layer. The first nitride semiconductor layer is disposed on the substrate. The second nitride semiconductor layer is disposed on the first nitride semiconductor layer and has a bandgap greater than that of the first nitride semiconductor layer. The first dielectric layer is disposed on the second nitride semiconductor layer. The second dielectric layer is disposed on the first dielectric layer. The second dielectric layer includes a first portion and a second portion separated from the first portion by a trench, wherein the trench terminates at an upper surface of the first dielectric layer.

According to some embodiments of the present disclosure, a semiconductor device structure includes a substrate, a first nitride semiconductor layer, a second nitride semiconductor layer, a first dielectric layer and a second dielectric layer. The first nitride semiconductor layer is disposed on the substrate. The second nitride semiconductor layer is disposed on the first nitride semiconductor layer and has a bandgap greater than that of the first nitride semiconductor layer. The first dielectric layer is disposed on the second nitride semiconductor layer. The second dielectric layer is disposed on the first dielectric layer. The second dielectric layer includes a first portion and a second portion separated from the first portion. The second portion is closer to an edge of the substrate than the first portion is, and the second portion of the second dielectric layer extends to a sidewall of the first dielectric layer.

According to some embodiments of the present disclosure, a method of manufacturing a semiconductor device structure includes: providing a substrate; forming a first nitride semiconductor layer on the substrate; forming a second nitride semiconductor layer on the first nitride semiconductor layer, wherein the second nitride semiconductor layer has a bandgap greater than that of the first nitride semiconductor layer; forming a first dielectric layer on the second nitride semiconductor layer; removing a portion of the first nitride semiconductor layer, the second nitride semiconductor layer and the first dielectric layer to define a recess on the substrate; forming a second dielectric layer on the first dielectric layer and the upper surface of the substrate; and performing a singulation technique on the recess to cut the second dielectric layer and the substrate.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 6A, FIG. 6B, FIG. 6C, FIG. 6D, FIG. 6E, FIG. 6F, FIG. 6G, FIG. 6H, FIG. 6I and FIG. 6J illustrate various stages of a method for manufacturing a semiconductor device structure after a stage shown in FIG. 6 in accordance with some embodiments of the present disclosure.

Figure 1:
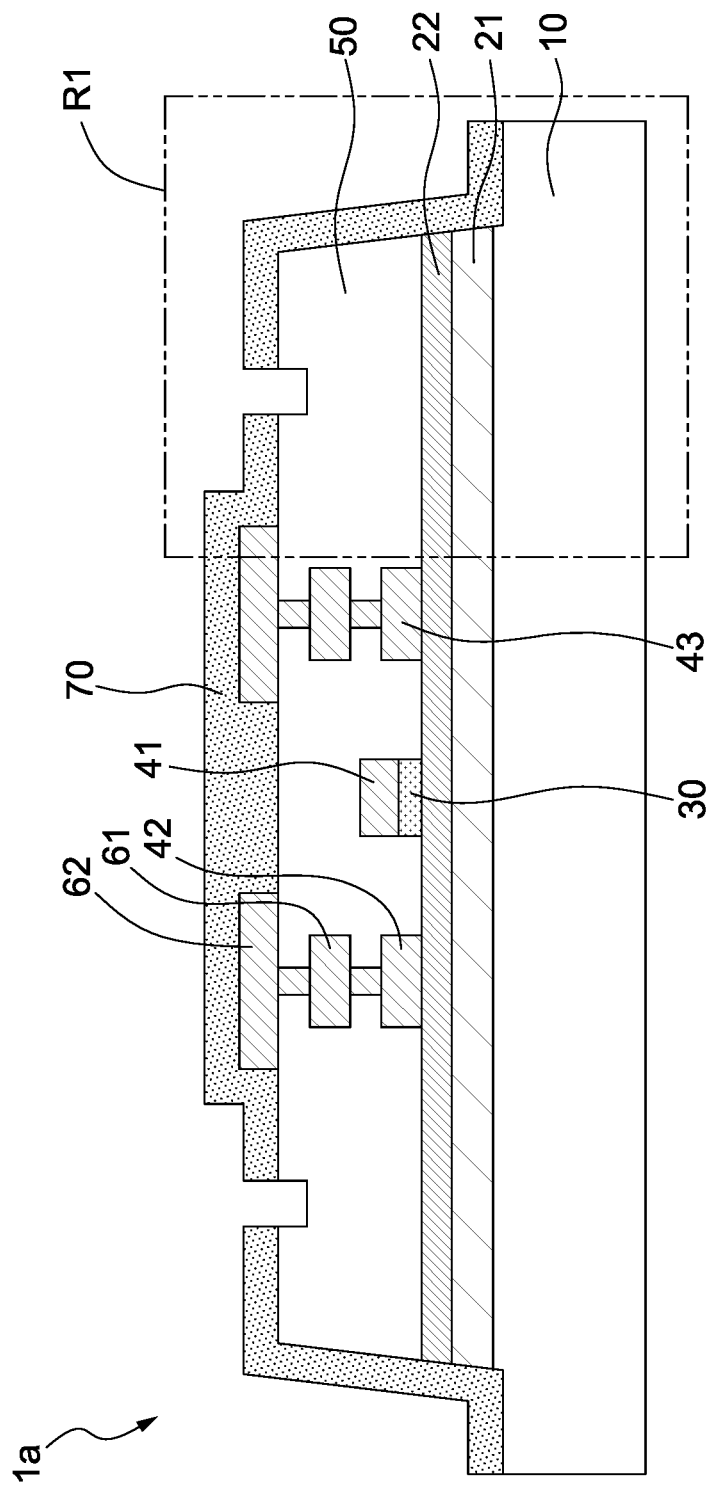
FIG. 1 is a cross-sectional of a semiconductor device structure in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

The following disclosure provides many different embodiments, or examples, for implementing different features of the provided subject matter. Specific examples of components and arrangements are described as follows. These are, of course, merely examples and are not intended to be limiting. In the present disclosure, reference to the formation or disposal of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail as follows. It should be appreciated, however, that the present disclosure provides many applicable concepts that can be embodied in a wide variety of specific contexts. The specific embodiments discussed are merely illustrative and do not limit the scope of the disclosure.

FIG. 1 is a cross-sectional of a semiconductor device structure 1a in accordance with some embodiments of the present disclosure. The semiconductor device structure 1a may include a substrate 10, a nitride semiconductor layer 21, a nitride semiconductor layer 22, a nitride semiconductor layer 30, a gate structure 41, an electrode 42, an electrode 43, a dielectric layer 50, a conductive layer 61, a conductive layer 62 and a dielectric layer 70.

The substrate 10 may include, without limitation, silicon (Si), doped Si, silicon carbide (SiC), germanium silicide (SiGe), gallium arsenide (GaAs), or other semiconductor materials. The substrate 10 may include, without limitation, sapphire, silicon on insulator (SOI), or other suitable materials.

A buffer layer (not shown) may be disposed on the substrate 10. The buffer layer may be configured to reduce defect due to the dislocation between the substrate 10 and the nitride semiconductor layer 21. The buffer layer may include, but is not limited to, nitride, such as AN, AlGaN or the like.

The nitride semiconductor layer 21 (or a channel layer) may be disposed on the buffer layer. The nitride semiconductor layer 21 may include a group III-V layer. The nitride semiconductor layer 21 may include, but is not limited to, a group III nitride, for example, a compound $In_aAl_bGa_{1-a-b}N$, in which $a+b\leq1$. The group III nitride further includes, but is not limited to, for example, a compound $Al_aGa_{(1-a)}N$, in which $a\leq1$. The nitride semiconductor layer 21 may include a gallium nitride (GaN) layer. GaN has a bandgap of about 3.4 eV. The thickness of the nitride semiconductor layer 21 may range, but is not limited to, from about 0.1 µm to about 1 µm.

The nitride semiconductor layer 22 (or a barrier layer) may be disposed on the nitride semiconductor layer 21. The nitride semiconductor layer 22 may include a group III-V layer. The nitride semiconductor layer 22 may include, but is not limited to, a group III nitride, for example, a compound $In_aAl_bGa_{1-a-b}N$, in which $a+b\leq1$. The group III nitride may further include, but is not limited to, for example, a compound $Al_aGa_{(1-a)}N$, in which $a\leq1$. The nitride semiconductor layer 22 may have a greater bandgap than that of the nitride semiconductor layer 21. The nitride semiconductor layer 22 may include an aluminum gallium nitride (AlGaN) layer. AlGaN has a bandgap of about 4.0 eV. The thickness of the nitride semiconductor layer 22 may range, but is not limited to, from about substrate 10 nm to about substrate 100 nm.

A heterojunction is formed between the nitride semiconductor layer 22 and the nitride semiconductor layer 21, and the polarization of the heterojunction forms a two-dimensional electron gas (2DEG) region in the nitride semiconductor layer 21.

The nitride semiconductor layer 30 (or a depletion layer) may be disposed on the nitride semiconductor layer 22. The nitride semiconductor layer 30 may be in direct contact with the nitride semiconductor layer 22. The nitride semiconductor layer 30 may be doped with impurities. The nitride semiconductor layer 30 may include p-type dopants. It is contemplated that the nitride semiconductor layer 30 may include a p-doped GaN layer, p-doped AlGaN layer, p-doped AlN layer or other suitable III-V group layers. The p-type dopants may include magnesium (Mg), beryllium (Be), zinc (Zn) and cadmium (Cd).

The nitride semiconductor layer 30 may be configured to control the concentration of the 2DEG in the nitride semiconductor layer 21. The nitride semiconductor layer 30 can be used to deplete the 2DEG directly under the nitride semiconductor layer 30.

The gate structure 41 may be disposed on the nitride semiconductor layer 30. The gate structure 41 may cover a portion of the nitride semiconductor layer 30. The gate structure 41 may be disposed between the electrode 42 and the electrode 43. The gate structure 41 may include a gate metal. The gate metal may include titanium (Ti), tantalum (Ta), tungsten (W), aluminum (Al), cobalt (Co), copper (Cu), nickel (Ni), platinum (Pt), lead (Pb), molybdenum (Mo) and compounds thereof (such as, but not limited to, titanium nitride (TiN), tantalum nitride (TaN), other conductive nitrides, or conductive oxides), metal alloys (such as aluminum-copper alloy (Al—Cu)), or other suitable materials. Although the upper surface of the nitride semiconductor layer 30 is completely covered by the gate structure 41 in FIG. 1, a portion of the upper surface of the nitride semiconductor layer 30 may be exposed from the gate structure 41 in other embodiments of the present disclosure due to the design requirements.

The electrode 42 (or a source electrode) may be disposed on the nitride semiconductor layer 22. The electrode 42 may be in contact with the nitride semiconductor layer 22. The electrode 42 may include, for example, without limitation, a conductive material. The conductive material may include metals, alloys, doped semiconductor materials (e.g., doped crystalline silicon), or other suitable conductive materials, such as Ti, Al, Ni, Cu, Au, Pt, Pd, W, TiN or other suitable materials. The electrode 42 may include a multilayer structure. For example, the electrode 42 may include a structure of two layers of different material. The electrode 42 may include a structure of three layers, two adjacent layers of which are made of different materials. The electrode 42 may be electrically connected to ground. The electrode 42 may be electrically connected to a virtual ground. The electrode 42 may be electrically connected to real ground.

The electrode 43 (or a drain electrode) may be disposed on the nitride semiconductor layer 22. The electrode 43 may be in contact with the nitride semiconductor layer 22. The electrode 43 may include, for example, without limitation, a conductive material. The conductive materials may include metals, alloys, doped semiconductor materials (e.g., doped crystalline silicon), or other suitable conductive materials, such as Ti, Al, Ni, Cu, Au, Pt, Pd, W, TiN, or other suitable materials. The electrode 43 may have a structure similar to or the same as that of the electrode 42. Although the electrode 42 and electrode 43 are respectively disposed on two opposite sides of the gate structure 41 in FIG. 1, the electrode 42, the electrode 43, and the gate structure 41 may have different configurations in other embodiments of the present disclosure due to the design requirements.

The dielectric layer 50 (or an interlayer dielectric, ILD) may be disposed on the nitride semiconductor layer 22. The dielectric layer 50 may include oxide layer, such as silicon oxide. The dielectric layer 50 may include other suitable materials. The dielectric layer 50 may include a plurality of layers without boundary. The dielectric layer 50 may include a plurality of layers with unobvious boundaries. The thickness of the dielectric layer 50 may range from approximately 3.5 µm to approximately 6.5 µm.

The conductive layer 61 (or M1 layer) may be embedded in the dielectric layer 50. The conductive layer 61 may have a plurality of segments electrically isolated from each other. The conductive layer 61 may be electrically connected to the electrode 42. The conductive layer 61 may be electrically connected to the electrode 43. The conductive layer 61 may include copper or other suitable materials.

The conductive layer 62 (or M2 layer) may be disposed on the dielectric layer 50. The conductive layer 62 (or M2 layer) may be disposed on the upper surface of the dielectric layer 50. The conductive layer 62 may be electrically connected to the conductive layer 61. The conductive layer 62 may have a plurality of segments electrically isolated from each other. The conductive layer 62 may be electrically connected to the electrode 42. The conductive layer 62 may be electrically connected to the electrode 43. The conductive layer 62 may include copper or other suitable materials.

The dielectric layer 70 may be disposed on the dielectric layer 50. The dielectric layer 70 may cover the conductive layer 62. The dielectric layer 70 may be configured to protect the conductive layer 62 from damage. The material of the dielectric layer 70 may be different from that of the dielectric layer 50. The dielectric layer 70 may include nitride, such as silicon nitride. The dielectric layer 70 may include other suitable materials. The thickness of the dielectric layer 70 may range from approximately 0.6 μm to approximately 0.8 μm.

Figure 2:
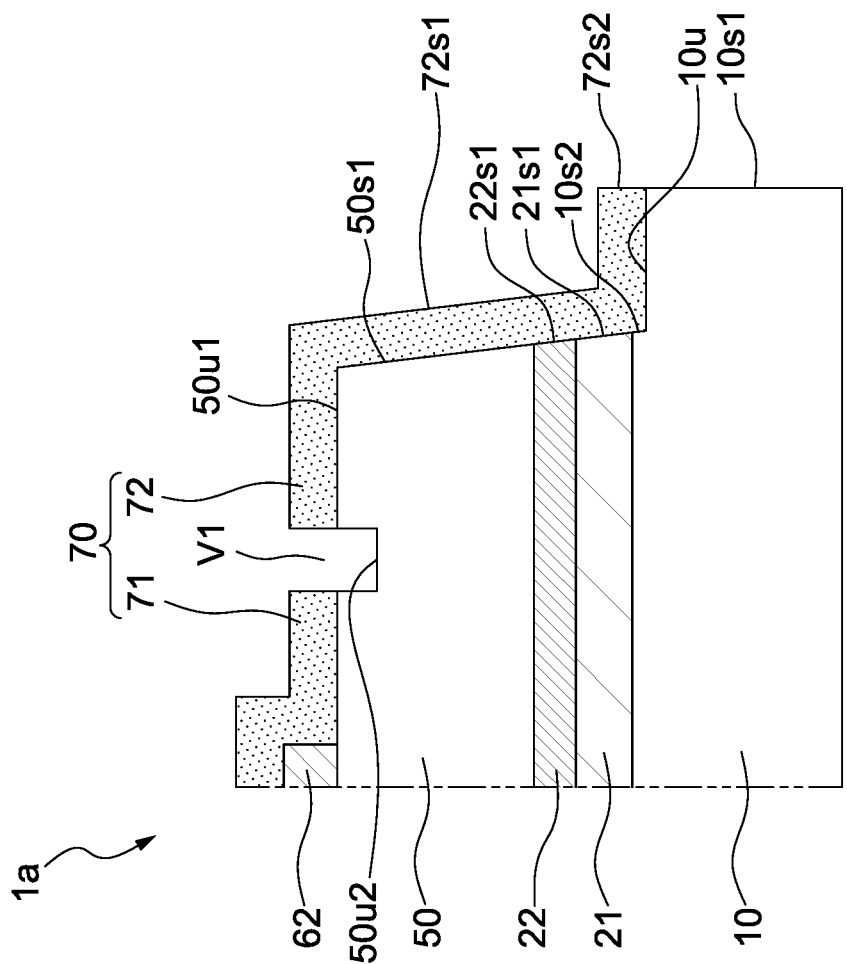
FIG. 2 is a partial enlarged view of the semiconductor device structure of FIG. 1.

FIG. 2 is a partial enlarged view of the region R1 of FIG. 1. As shown in FIG. 2, the dielectric layer 70 may include a portion 71 and a portion 72. The portion 71 may cover the conductive layer 62. The portion 71 may be in contact with the dielectric layer 50. The portion 71 may be in contact with a surface $50u1$ (or an upper surface) of the dielectric layer 50. As shown in FIGS. 1 and 2, the portion 71 may cover the electrode 42; the portion 71 may cover the electrode 43; the portion 71 may cover the gate structure 41.

The portion 72 may be separated from the portion 71 by a trench V1. As shown in FIGS. 1 and 2, the portion 72 may surround the portion 71. The portion 72 may be free from overlapping the conductive layer 62 along a vertical direction, which may be orthogonal to an interface between the nitride semiconductor layer 21 and the nitride semiconductor layer 22; the portion 72 may be free from overlapping the electrode 42 along the vertical direction; the portion 72 may be free from overlapping the electrode 43 along the vertical direction; the portion 72 may be free from overlapping the gate structure 41 along the vertical direction.

The portion 72 may be closer to an edge of the substrate 10 than the portion 71 is. The portion 72 may have a Z-shaped profile in a cross sectional view. The portion 72 may have a corner on the dielectric layer 50. The portion 72 may have a corner on the surface $50u1$ of the dielectric layer 50. The portion 72 may have a corner on the substrate 10. The portion 72 may extend from the dielectric layer 50 to the substrate 10. The portion 72 may extend from the dielectric layer 50 to the substrate 10 through the nitride semiconductor layer 22 and the nitride semiconductor layer 21. The portion 72 may extend continuously from the dielectric layer 50 to the substrate 10 through the nitride semiconductor layer 22 and the nitride semiconductor layer 21.

The portion 72 may be in contact with the surface $50u1$ of the dielectric layer 50. The portion 72 may be disposed on the sidewall $50s1$ of the dielectric layer 50. The portion 72 may be in contact with the sidewall $50s1$ of the dielectric layer 50. The portion 72 may be disposed on the sidewall $22s1$ of the nitride semiconductor layer 22. The portion 72 may be in contact with the sidewall $22s1$ of the nitride semiconductor layer 22. The portion 72 may be disposed on the sidewall $21s1$ of the nitride semiconductor layer 21. The portion 72 may be in contact with the sidewall $21s1$ of the nitride semiconductor layer 21. The portion 72 may be in contact with the sidewall $10s2$ of the substrate 10. The sidewalls $50s1$, $22s1$, $21s1$ and $10s2$ may be substantially coplanar to each other. The portion 72 may be disposed on a surface $10u$ (or an upper surface) of the substrate 10. The portion 72 may cover the surface $10u$ of the substrate 10. The portion 72 may be in contact with the surface $10u$ of the substrate 10. The portion 72 may include a surface $72s1$ (or a side surface) and a surface $72s2$ (or a side surface). The surface $72s1$ may not be coplanar with the surface $72s2$. The surface $72s2$ may be substantially coplanar with a surface $10s1$ (or a side surface) of the substrate 10.

The trench V1 may be located between the edge of the substrate 10 and the conductive layer 62. The trench V1 may penetrate the dielectric layer 70. The trench V1 may penetrate a portion of the dielectric layer 50. The trench V1 may expose a portion of the dielectric layer 50. The trench V1 may expose a portion of the dielectric layer 50 from the dielectric layer 70. The trench V1 may terminate at a surface $50u2$ (or an upper surface) of the dielectric layer 50. The surface $50u2$ may have an elevation less than that of the surface $50u1$.

In this embodiment, the surface $10u$ of the substrate 10 is covered by the dielectric layer 70. The dielectric layer 70 may protect the substrate 10 from damage due to discharge breakdown, which will be described later.

Figure 3:
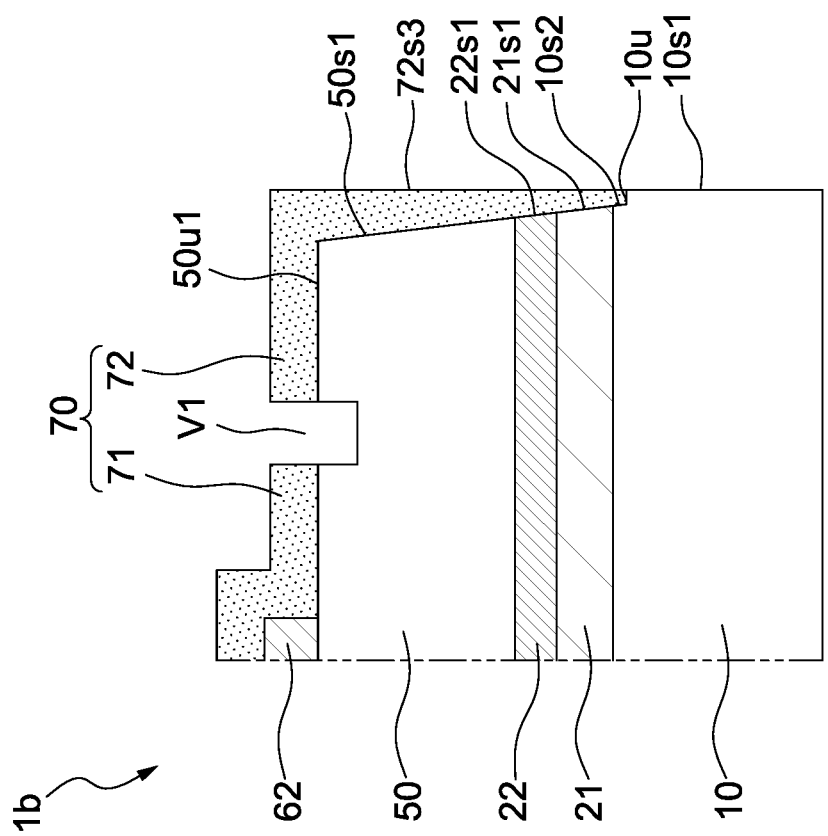
FIG. 3 is a cross-sectional of a semiconductor device structure in accordance with some embodiments of the present disclosure.

FIG. 3 is a cross-sectional of a semiconductor device structure 1b in accordance with some embodiments of the present disclosure. The semiconductor device structure 1b may have a structure similar to the semiconductor device structure 1a in FIG. 2 except that the profile of the portion 72.

The portion 72 may include an L-shaped profile. The portion 72 may extend from the surface $50u1$ to the surface $10u$ of the substrate 10. The portion 72 may terminate at the surface $10u$ of the substrate 10. The portion 72 may have a portion tapered along a direction from the dielectric layer 50 toward the substrate 10. The portion 72 may have different thickness on the surface $50u1$ of the dielectric layer 50 and on the sidewall $50s1$ of the dielectric layer 50. The portion 72 may have a length along the vertical direction greater than a length along a horizontal direction. The portion 72 may have a corner on the surface $50u1$ of the dielectric layer 50. The sidewall $72s3$ may be substantially coplanar with the surface $10s1$ of the substrate 10.

Figure 4:
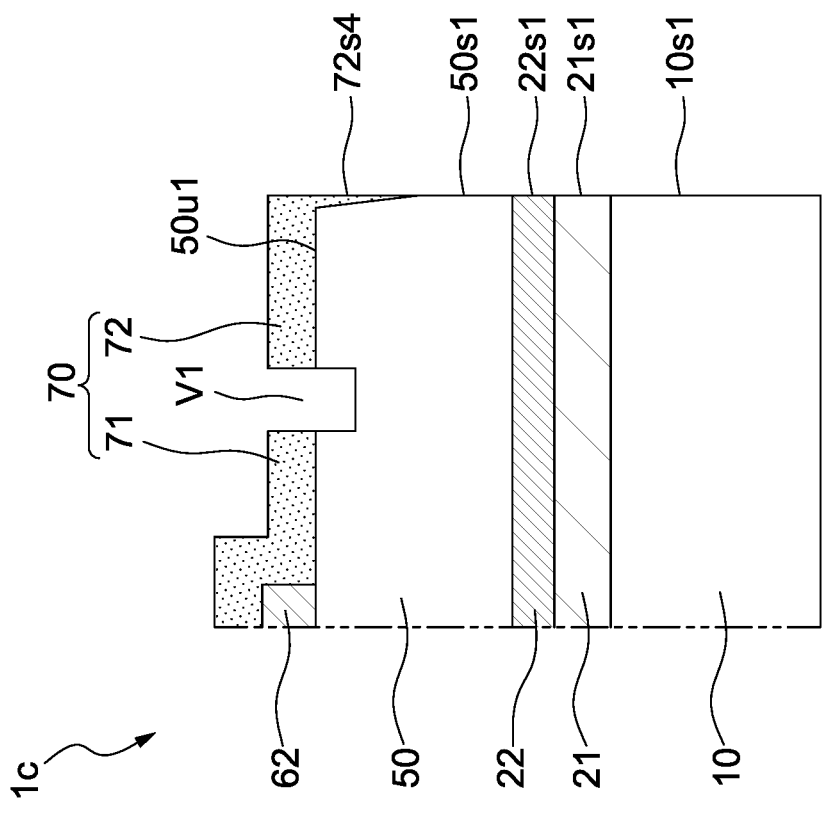
FIG. 4 is a cross-sectional of a semiconductor device structure in accordance with some embodiments of the present disclosure.

FIG. 4 is a cross-sectional of a semiconductor device structure 1c in accordance with some embodiments of the present disclosure. The semiconductor device structure 1c may have a structure similar to the semiconductor device structure 1a in FIG. 2 except that the profile of the portion 72.

The portion 72 may include a L-shaped profile. The portion 72 may extend from the surface $50u1$ to the sidewall $50s1$ of the dielectric layer 50. The portion 72 may terminate at the sidewall $50s1$ of the dielectric layer 50. The surface $72s4$ may be coplanar with the sidewall $50s1$ of the dielectric layer 50. The surface $72s4$ may be coplanar with the sidewall $22s1$ of the nitride semiconductor layer 22. The surface $72s4$ may be coplanar with the sidewall $21s1$ of the nitride semiconductor layer 21. The surface $72s4$ may be coplanar with the surface $10s1$ of the substrate 10. The portion 72 may have a length along the vertical direction less than a length along the horizontal direction. Although FIG. 4 illustrates that the portion 72 terminates at the sidewall $50s1$ of the dielectric layer 50, it is contemplated that the portion 72 may terminate at the sidewall $21s1$ of the nitride semiconductor layer 21. Although FIG. 4 illustrates that the portion 72 terminates at the sidewall $50s1$ of the dielectric layer 50, it is contemplated that the portion 72 may terminate at the sidewall 22s1 of the nitride semiconductor layer 22.

Figure 5:
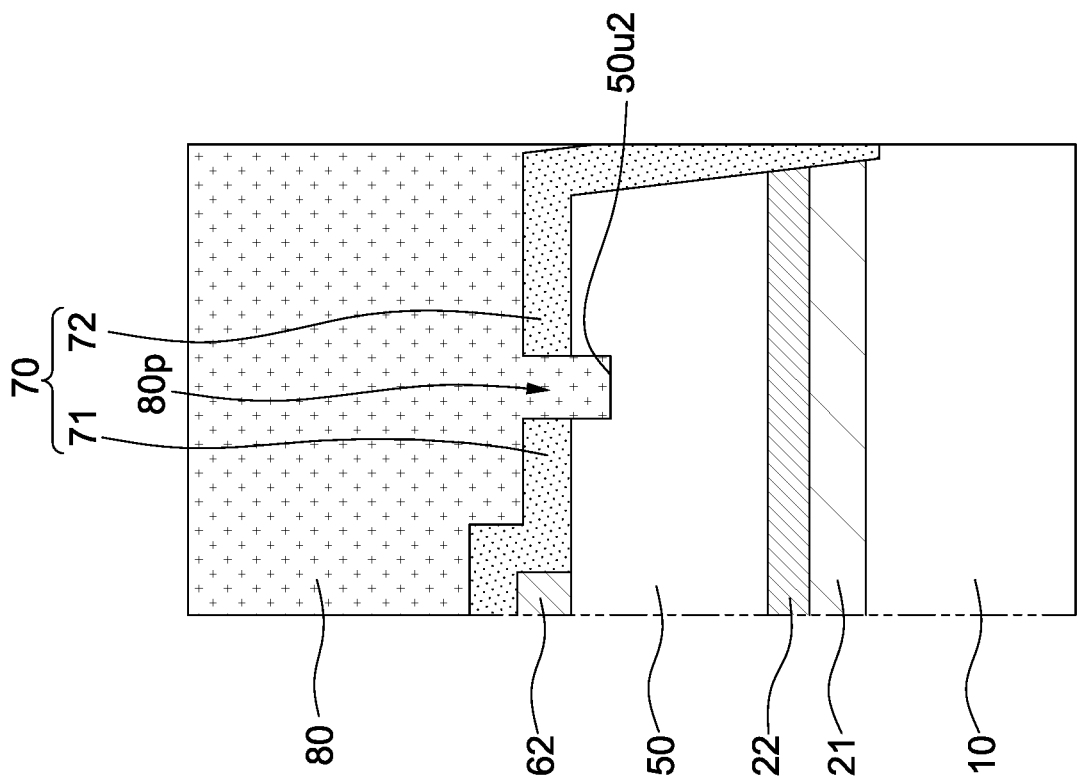
FIG. 5 is a cross-sectional of a semiconductor device structure in accordance with some embodiments of the present disclosure.

FIG. 5 is a cross-sectional of a semiconductor device structure 1d in accordance with some embodiments of the present disclosure. The semiconductor device structure 1d may have a structure similar to the semiconductor device structure 1b except that the semiconductor device structure 1d may further include an encapsulant 80.

The encapsulant 80 may be disposed on the dielectric layer 70. The encapsulant 80 may penetrate the dielectric layer 70. The encapsulant 80 may penetrate a portion of the dielectric layer 50. The encapsulant 80 may separate the portion 71 from the portion 72. The encapsulant 80 may have an extension 80p. The extension 80p may fill in the trench V1. The encapsulant 80 may be in contact with the dielectric layer 50. The encapsulant 80 may be in contact with the surface 50u2 of the dielectric layer 50. The encapsulant 80 may be in contact with a side surface of the portion 71. The encapsulant 80 may be in contact with a side surface of the portion 72. The encapsulant 80 may include insulation or dielectric material. The encapsulant 80 may be made of molding material that may include, for example, a Novolac-based resin, an epoxy-based resin, a silicone-based resin, or other another suitable encapsulant. Suitable fillers may also be included, such as powdered $SiO_2$.

The semiconductor device structures 1a-1d of the present disclosure can be applied in, without limitation, HEMT devices, especially in low voltage HEMT devices, high voltage HEMT devices and radio frequency (RF) HEMT devices.

Figure 6:
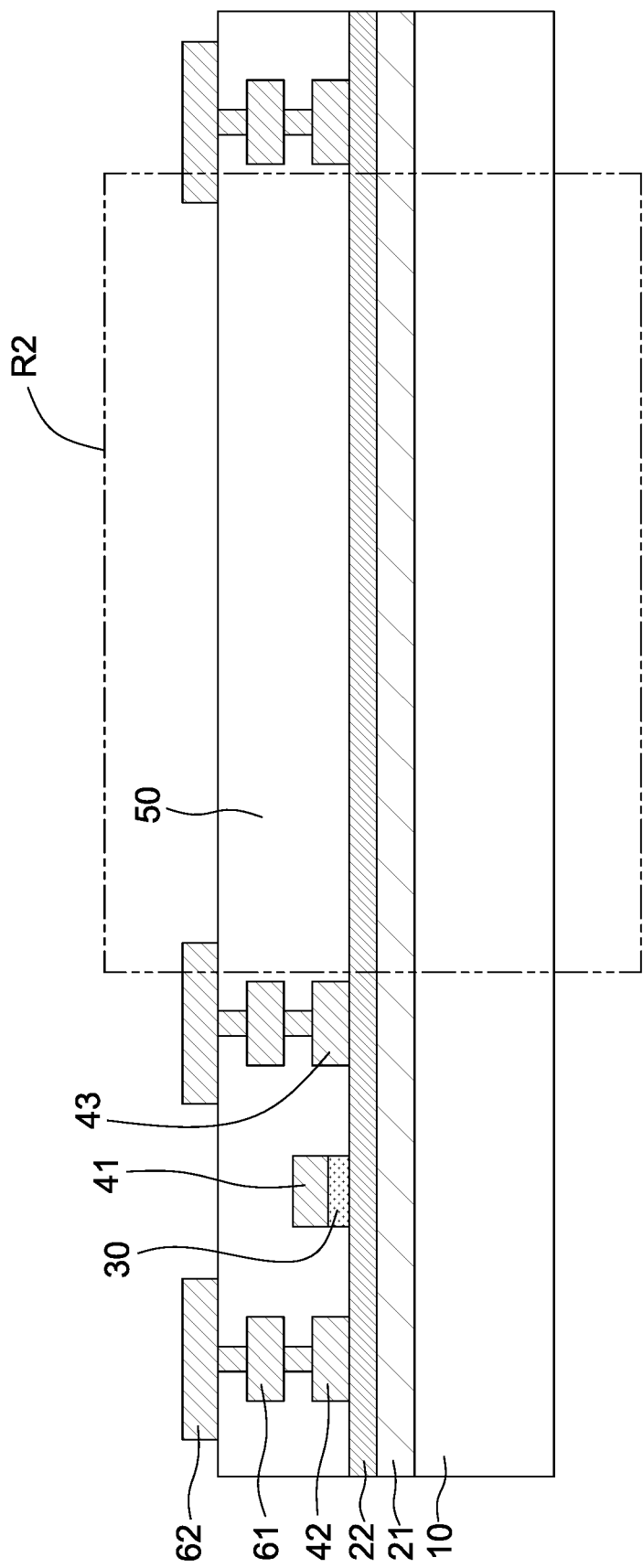
FIG. 6 is a cross-sectional of a structure in a middle stage of manufacturing a semiconductor device structure in accordance with some embodiments of the present disclosure.

FIG. 6 is a cross-sectional of a structure in a middle stage of manufacturing a semiconductor device structure in accordance with some embodiments of the present disclosure.

A substrate 10 may be provided. A nitride semiconductor layer 21, a nitride semiconductor layer 22, a nitride semiconductor layer 30, a gate structure 41, an electrode 42, an electrode 43, a dielectric layer 50, a conductive layer 61 and a conductive layer 62 may be formed on the substrate 10.

FIG. 6A, FIG. 6B, FIG. 6C, FIG. 6D, FIG. 6E, FIG. 6F, FIG. 6G, FIG. 6H, FIG. 6I and FIG. 6J illustrate various stages of a method for manufacturing a semiconductor device structure.

Figure 6A:
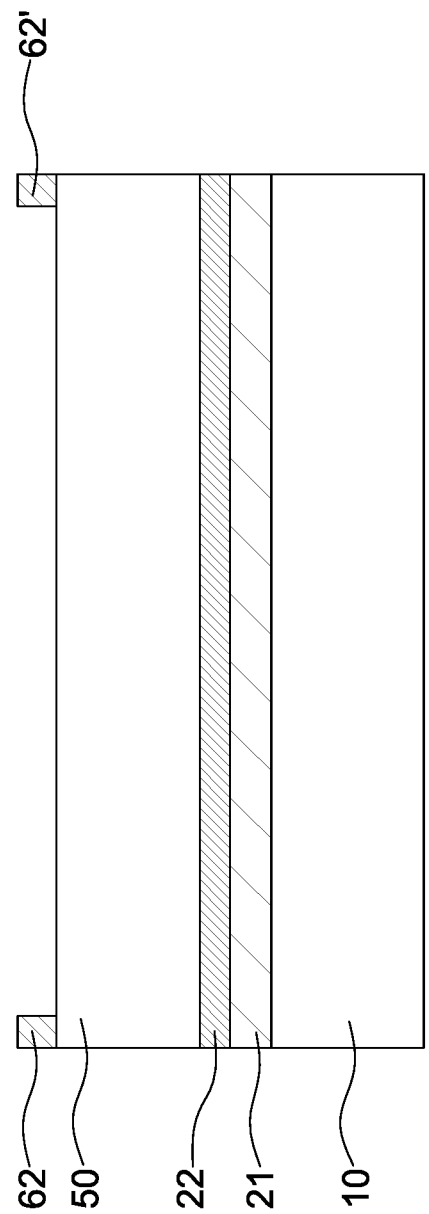

Referring to FIG. 6A, FIG. 6A illustrates the region R2 of FIG. 6. A conductive layer 62 and a conductive layer 62' may be formed on the dielectric layer 50. The conductive layer 62' and the conductive layer 62 may be included in different semiconductor device structures after a singulation technique is performed. A singulation region (not shown in FIG. 6A) may be formed between the conductive layer 62 and the conductive layer 62' in the subsequent stages.

Referring to FIG. 6B, a photoresist 91 may be formed on the dielectric layer 50. The photoresist 91 may cover the conductive layer 62 and the conductive layer 62'. A portion of the dielectric layer 50 may be exposed from the photoresist 91.

Figure 6C:
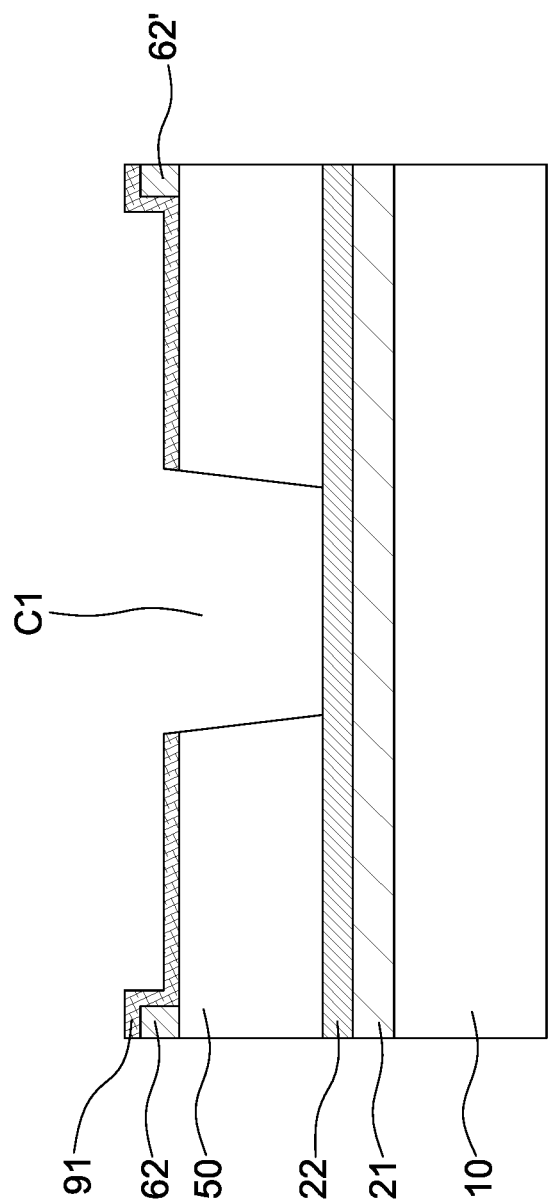

Referring to FIG. 6C, an etching technique may be performed. The portion of the dielectric layer 50 exposed from the photoresist 91 may be removed such that a recess C1 may be formed. The nitride semiconductor layer 22 may be exposed. A portion of the photoresist 91 may be removed. A remaining portion of the photoresist 91 may cover the dielectric layer 50. The remaining portion of the photoresist 91 may cover the conductive layer 62 and the conductive layer 62'.

Figure 6D:
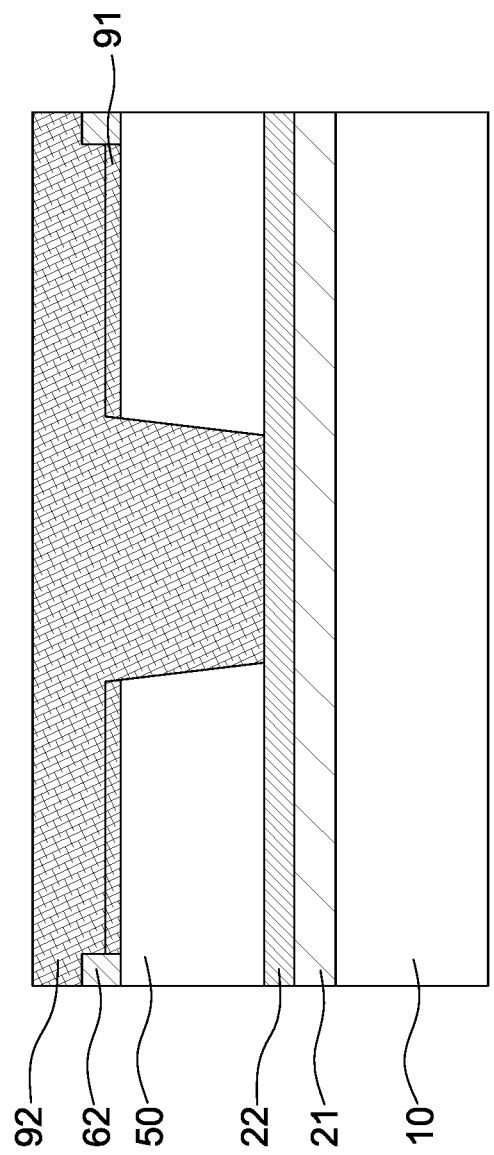

Referring to FIG. 6D, a photoresist 92 may be formed. The photoresist 92 may cover the remaining portion of the photoresist 91. The photoresist 92 may fill the recess C1.

Figure 6E:
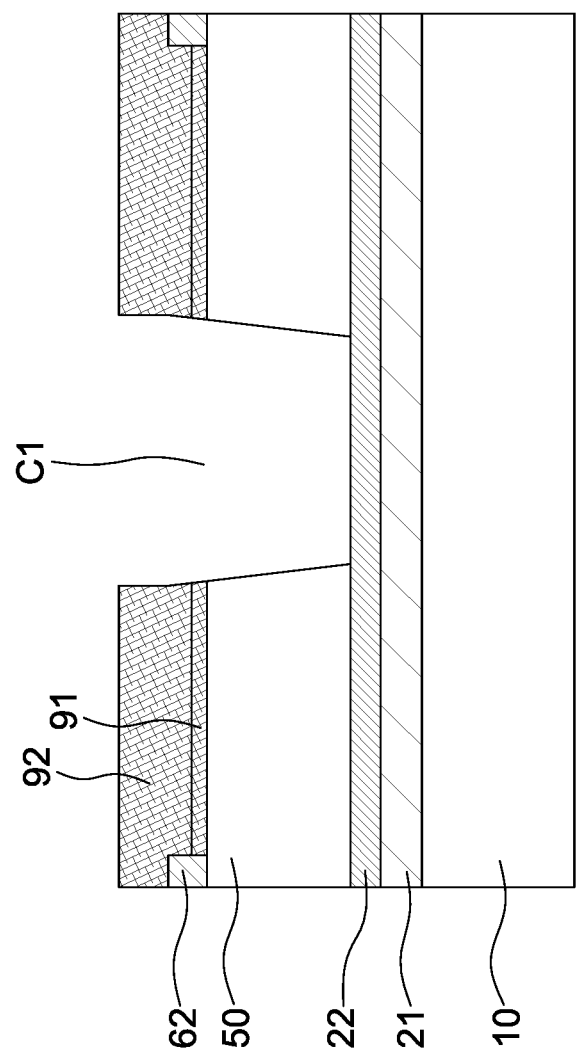

Referring to FIG. 6E, an etching technique may be performed. The portion of the photoresist 92 may be removed such that the recess C1 may be formed. The nitride semiconductor layer 22 may be exposed.

Figure 6F:
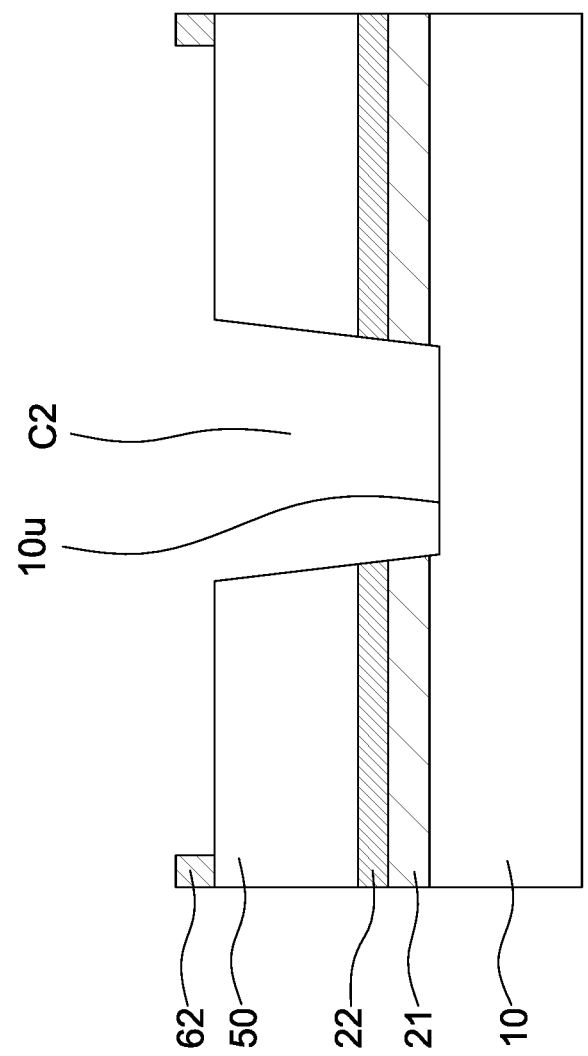

Referring to FIG. 6F, the etching technique in FIG. 6E may continue. The photoresist 91 may be removed. The photoresist 92 may be removed. A portion of the nitride semiconductor layer 22 may be removed. A portion of the nitride semiconductor layer 21 may be removed. A portion of the substrate 10 may be removed. The surface 10u of the substrate 10 may be exposed. A recess C2 may be formed. The recess C2 may be defined by the substrate 10, the nitride semiconductor layer 21, the nitride semiconductor layer 22 and the dielectric layer 50.

Figure 6G:
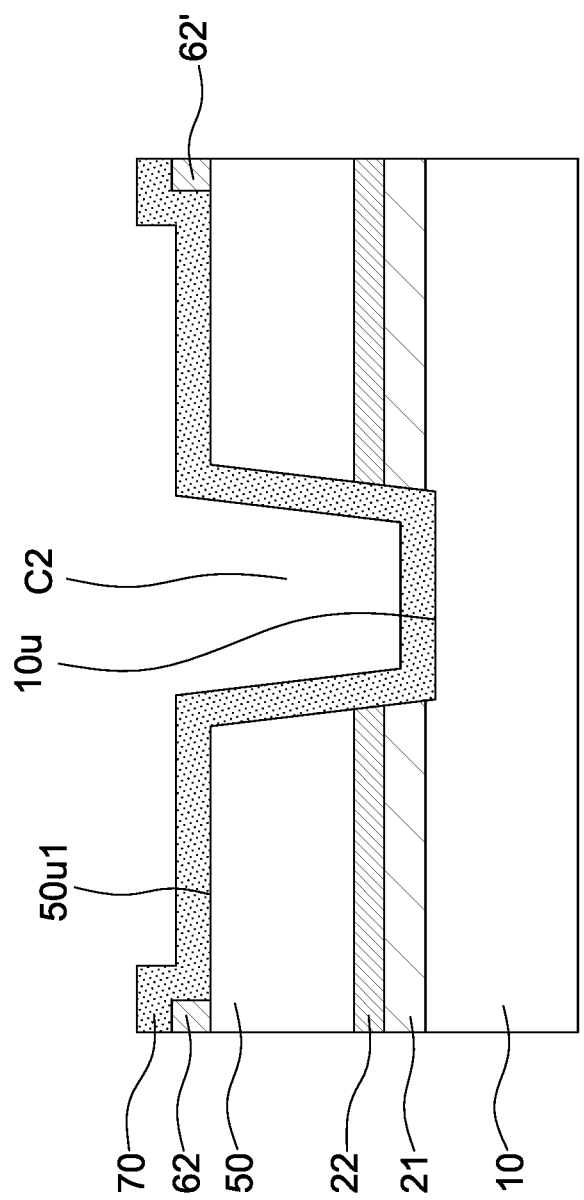

Referring to FIG. 6G, a dielectric layer 70 may be formed. The dielectric layer 70 may cover the conductive layer 62 and the conductive layer 62'. The dielectric layer 70 may cover the surface 50u1 of the dielectric layer 50. The dielectric layer 70 may be conformally formed in the recess C2. The surface 10u of the substrate 10 may be covered by the dielectric layer 70.

Figure 6H:
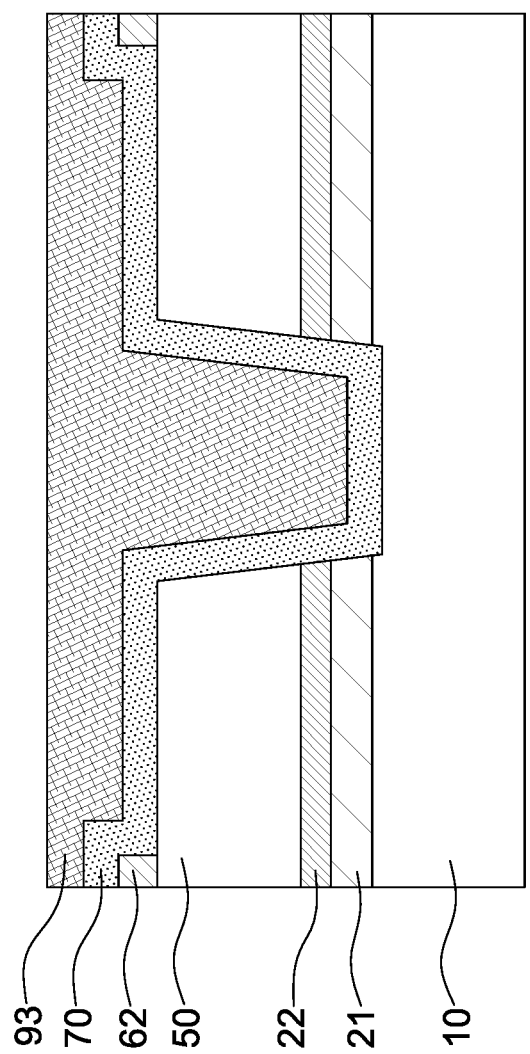

Referring to FIG. 6H, a photoresist 93 may be formed. The photoresist 93 may cover the dielectric layer 70. The photoresist 93 may fill the recess C2.

Figure 6I:
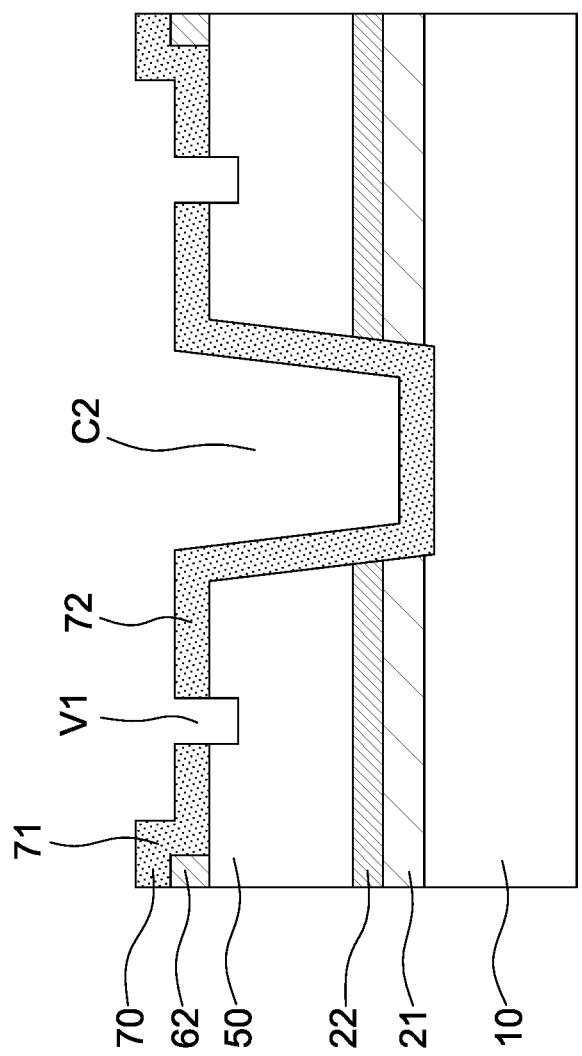

Referring to FIG. 6I, an etching technique may be formed. A portion of the dielectric layer 70 and the dielectric layer 50 may be removed such that a portion 71 and a portion 72 may be formed. The portion 71 and the portion 72 may be separated from a trench V1. The trench V1 may penetrate the dielectric layer 70 such that a portion of the dielectric layer 50 may be exposed. The portion 72 may be formed within the recess C2.

Figure 6J:
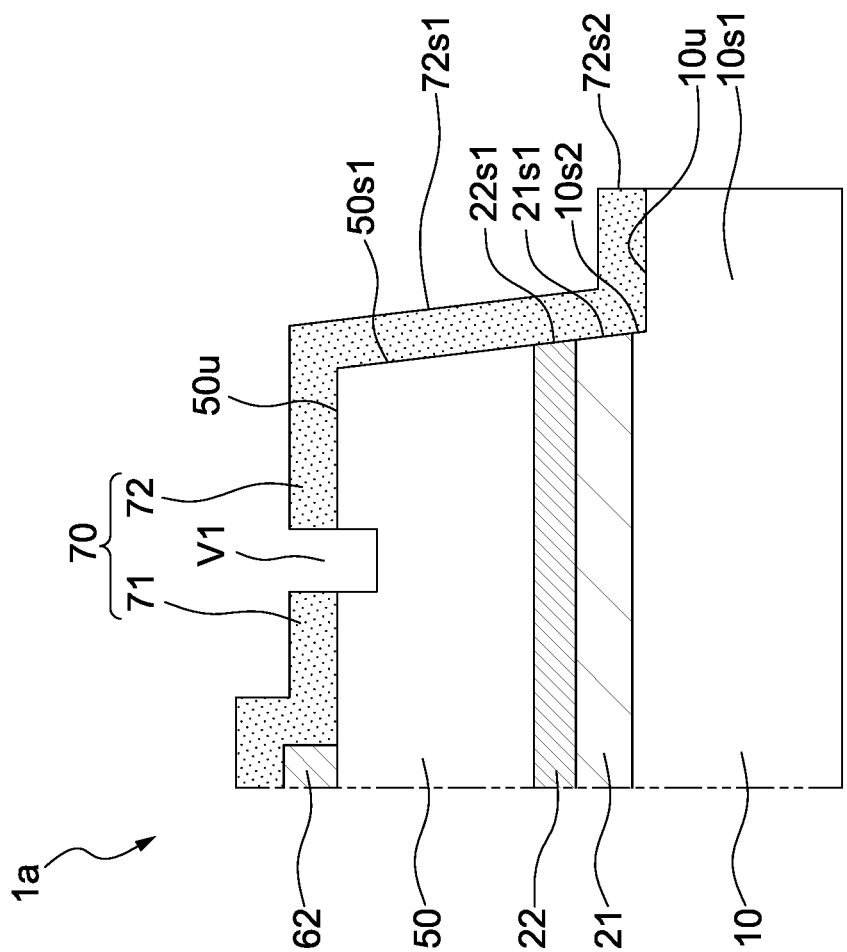

Referring to FIG. 6J, a singulation technique may be performed to create a plurality of semiconductor device structure the same as or similar to the semiconductor device structure 1a described and illustrated in FIG. 1. The recess C2 may serve as a singulation region in which a saw cuts. When the dielectric layer 70 is made of a nitride, the singulation technique may incur cracks formed within the dielectric layer 70 because the physical property of nitride is fragile. The cracks may be formed from the region in which the saw cuts and extend toward the conductive layer 62 and above the gate structure 41, electrode 42 and electrode 43, decreasing the reliability of the semiconductor device structure. In a comparative example, in order to prevent crack from extending to the conductive layer 62, the dielectric layer 70 is removed from the recess C2 before the singulation technique such that the saw can cut the substrate 10 without cutting the dielectric layer 70. In order to remove the dielectric layer 70 within the recess C2, a photoresist pattern should be defined to expose the dielectric layer 70 within the recess C2 and cover the dielectric layer 70 external to the recess C2. Because the recess C2 has a relatively great depth, the photoresist filling the recess C2 may also have a relatively great thickness. Therefore, two or more exposure techniques may be required to remove the photoresist within the recess C2. As a result, the cost and the cycle time are increased.

In this embodiment, the dielectric layer 70 within the recess C2 may remain. In this embodiment, the trench V1 is formed. The dielectric layer 70 is separated into the portion 71 and the portion 72 by the trench V1. After the singulation technique is performed, the crack may be formed within the portion 72 and terminate at a side closer to the trench V1. The portion 71 may be free from damage of the crack, thereby improving the reliability of the semiconductor device structure. Further, only one step of etching technique is required to define the photoresist pattern for forming the trench V1. Therefore, the cost and the cycle time for manufacturing the semiconductor device structures are improved.

Electrical tests, such as breakdown voltage test, is performed before the singulation technique. When the electrical test is performed, a relatively great voltage, such as 650V, may impose on the drain electrode. During the test, discharge breakdown may occur between the drain electrode and the substrate, decreasing the reliability of the semiconductor device structure. In this embodiment, the surface 10u of the substrate 10 is covered by the dielectric layer 70 during the test. The dielectric layer 70 may protect the substrate 10 from damage of discharge breakdown, thereby improving the reliability of the semiconductor device structure.

It is contemplated that in FIG. 6I, if the saw cuts the structure external to the recess C2, a semiconductor device same or similar to the semiconductor device 1b as illustrated and described with reference to FIG. 3 can be formed.

It is contemplated that in FIG. 6I, if the saw cuts the structure external to the recess C2, a semiconductor device same or similar to the semiconductor device 1c as illustrated and described with reference to FIG. 4 can be formed.

It is contemplated that in FIG. 6I, if the saw cuts the structure external to the recess C2 and a encapsulant is formed on the dielectric layer 70, a semiconductor device same or similar to the semiconductor device 1d as illustrated and described with reference to FIG. 5 can be formed.

FIG. 7A, FIG. 7B, FIG. 7C, FIG. 7D and FIG. 7E illustrate various stages of a method for manufacturing a semiconductor device structure of a comparative example. The processes before FIG. 7A may be the same as or similar to the processes from FIG. 6A to FIG. 6G, and are not repeated herein.

Figure 7A:
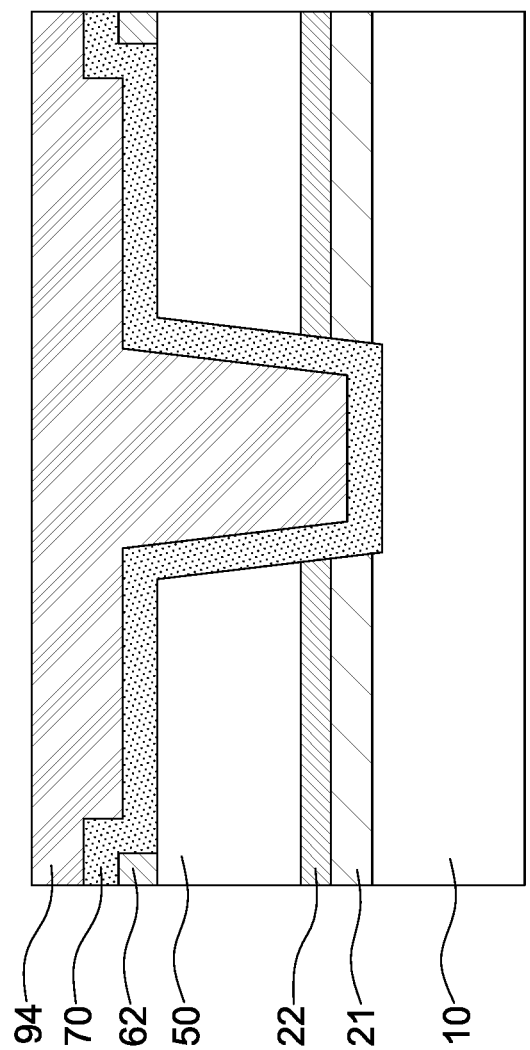
FIG. 7A, FIG. 7B, FIG. 7C, FIG. 7D and FIG. 7E illustrate various stages of a method for manufacturing a semiconductor device structure of a comparative example.

Referring to FIG. 7A, a photoresist 94 may be formed on the dielectric layer 70 and fill the recess C2.

Figure 7B:
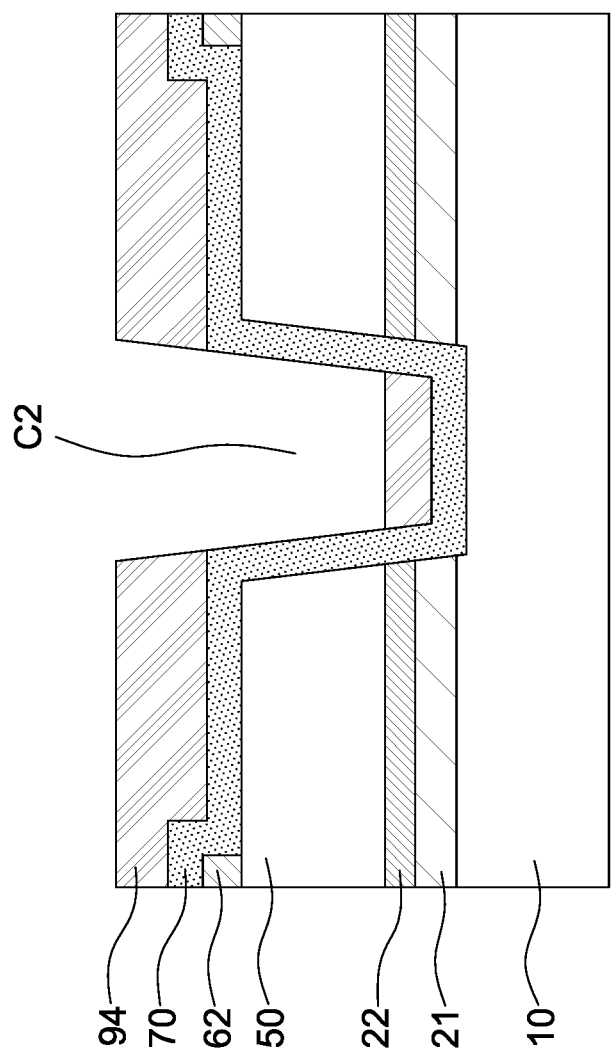

Referring to FIG. 7B, an exposure technique may be performed to remove a portion of the photoresist 94. The photoresist 94 external to the recess C2 remains and covers the dielectric layer 70. Since the thickness of the dielectric layer 50 may be relatively great (e.g., 3.5 μm), the photoresist 94 within the recess C2 has a relative great thickness. Therefore, after performing one exposure technique, a portion of the photoresist 94 remains within the recess.

Figure 7C:
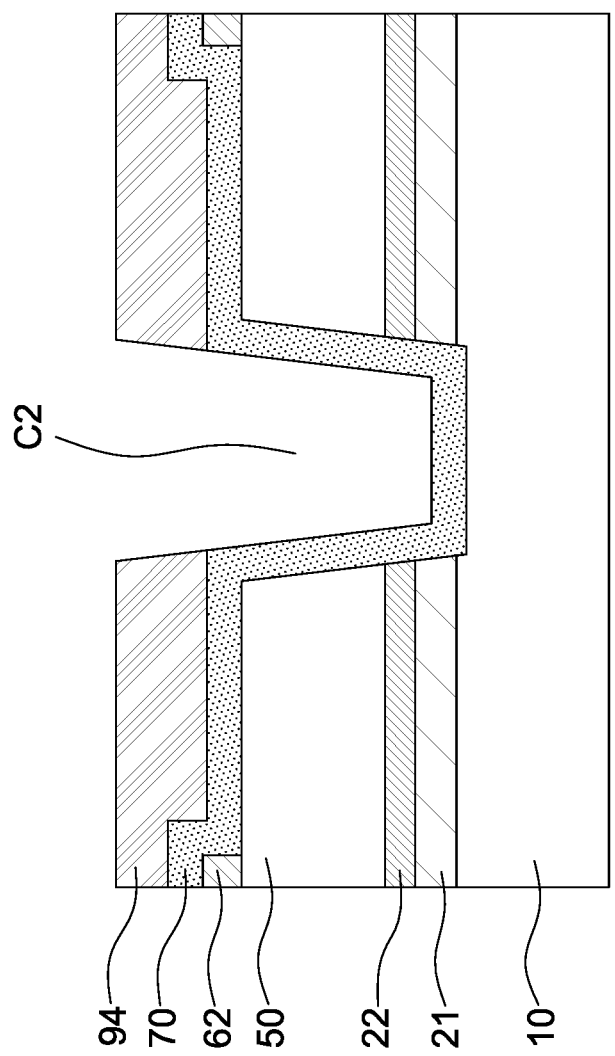

Referring to FIG. 7C, an additional exposure technique may be performed to remove the photoresist 94 within recess C2 such that the portion of the photoresist 94 external to the recess C2 is removed.

Figure 7D:
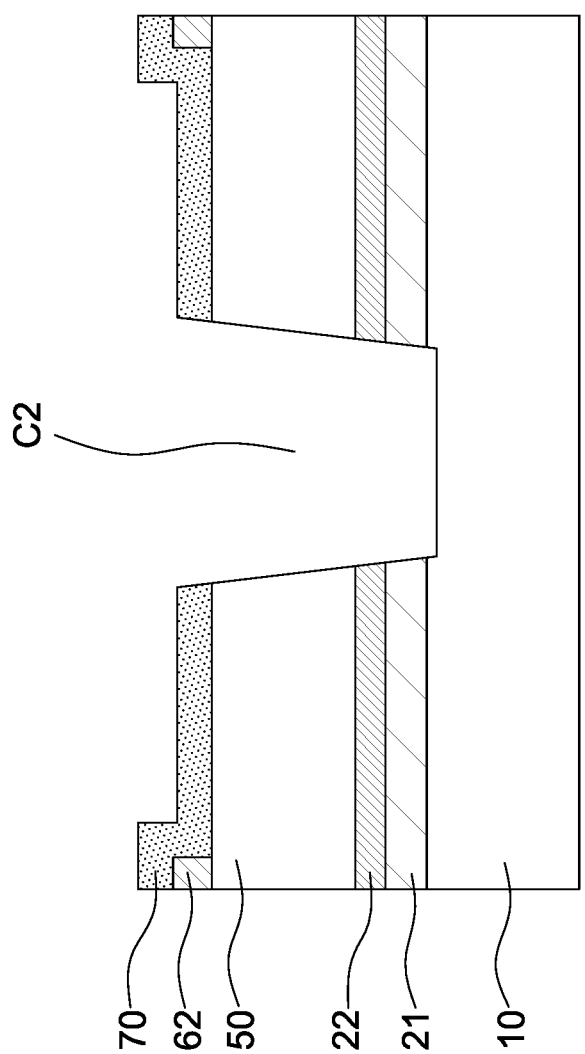

Referring to FIG. 7D, an etching technique may be performed to remove the dielectric layer 70 within the recess C2. The surface 10u of the substrate 10 may be exposed after the etching technique is performed.

Figure 7E:
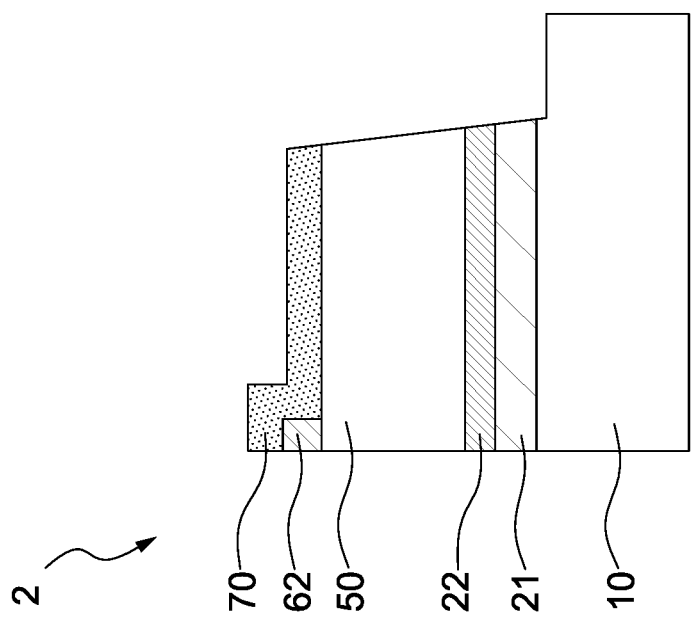

Referring to FIG. 7E, a singulation technique may be performed to form a semiconductor device structure 2. In this comparative example, in order to prevent the saw cutting the dielectric layer 70, the dielectric layer 70 within the singulation region is removed before the singulation technique. However, at least two exposure techniques are required in the comparative example. Further, the surface 10u of the substrate 10 is exposed, which may cause discharge breakdown during electrical tests.

As used herein, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated encapsulant 80 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event of circumstance occurs precisely as well as instances in which the event or circumstance occurs to a close approximation. As used herein with respect to a given value or range, the term "about" generally refers to within ±substrate 10%, ±5%, ±1%, or ±0.5% of the given value or range. Ranges can be expressed herein as from one endpoint to another endpoint or between two endpoints. All ranges disclosed herein are inclusive of the endpoints, unless specified otherwise. The term "substantially coplanar" can refer to two surfaces within micrometers (μm) of lying along a same plane, such as within substrate 10 μm, within 5 μm, within 1 μm, or within 0.5 μm of lying along the same plane. When referring to numerical values or characteristics as "substantially" the same, the term can refer to the values lying within ±substrate 10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A semiconductor device structure, comprising:
   a substrate;
   a first nitride semiconductor layer disposed on the substrate;
   a second nitride semiconductor layer disposed on the first nitride semiconductor layer and having a bandgap greater than that of the first nitride semiconductor layer;
   a first dielectric layer disposed on the second nitride semiconductor layer; and
   a second dielectric layer disposed on the first dielectric layer,
   wherein the second dielectric layer comprises a first portion and a second portion separated from the first portion by a trench, wherein the trench terminates at a first upper surface of the first dielectric layer;
   the second portion of the second dielectric layer extends from a second upper surface of the first dielectric layer to an upper surface of the substrate in a cross sectional view; and
   the second portion of the second dielectric comprises a surface in direct contact with and coplanar with the upper surface of the substrate.

2. The semiconductor device structure of claim 1, wherein the second portion of the second dielectric layer surrounds the first portion of the second dielectric layer.

3. The semiconductor device structure of claim 1, wherein the first dielectric layer is exposed from the second dielectric layer through the trench.

4. The semiconductor device structure of claim 3, wherein the trench penetrates a portion of the first dielectric layer.

5. The semiconductor device structure of claim 1, wherein the second portion of the second dielectric layer extends from the second upper surface of the first dielectric layer to a sidewall of the first dielectric layer in a cross sectional view.

6. The semiconductor device structure of claim 1, wherein the second portion of the second dielectric layer extends from the second upper surface of the first dielectric layer to a sidewall of the first nitride semiconductor layer in a cross sectional view.

7. The semiconductor device structure of claim 1, wherein the second portion of the second dielectric layer is L-shaped in a cross sectional view and comprises a corner on the first dielectric layer.

8. The semiconductor device structure of claim 1, wherein the second portion of the second dielectric layer is Z-shaped in a cross sectional view and comprises a first corner on the first dielectric layer and a second corner on the substrate.

9. The semiconductor device structure of claim 1, further comprising:
a conductive layer disposed on the first dielectric layer, wherein the conductive layer is covered by the first portion of the second dielectric layer.

10. The semiconductor device structure of claim 1, wherein a thickness of the second dielectric layer ranges from approximately 0.6 µm to approximately 0.8 µm, and a thickness of the first dielectric layer ranges from approximately 3.5 µm to approximately 6.5 µm.

11. A semiconductor device structure, comprising:
a substrate;
a first nitride semiconductor layer disposed on the substrate;
a second nitride semiconductor layer disposed on the first nitride semiconductor layer and having a bandgap greater than that of the first nitride semiconductor layer;
a first dielectric layer disposed on the second nitride semiconductor layer; and
a second dielectric layer disposed on the first nitride semiconductor layer, wherein the second dielectric layer comprises a first portion and a second portion separated from the first portion, the second portion is closer to an edge of the substrate than the first portion is, and the second portion of the second dielectric layer extends from an upper surface of the first dielectric layer to a sidewall of the first dielectric layer and further to an upper surface of the substrate in a cross sectional view; and the second portion of the second dielectric comprises a surface in direct contact with and coplanar with the upper surface of the substrate.

12. The semiconductor device structure of claim 11, wherein the second dielectric layer comprises silicon nitride.

13. The semiconductor device structure of claim 11, further comprising:
a trench separating the first portion and the second portion of the second dielectric layer, wherein the trench exposes a portion of the first dielectric layer from the second dielectric layer.

14. The semiconductor device structure of claim 11, wherein the second portion of the second dielectric layer surrounds the first portion of the second dielectric layer.

15. The semiconductor device structure of claim 11, wherein a portion of the second portion of the second dielectric layer is disposed on the sidewall of the first dielectric layer in a cross sectional view.

16. The semiconductor device structure of claim 11, wherein a portion of the second portion of the second dielectric layer is disposed on a sidewall of the first nitride semiconductor layer in a cross sectional view.

17. The semiconductor device structure of claim 1, wherein the second portion of the second dielectric layer comprises a first transverse extension, a vertical extension and a second transverse extension,
wherein the first transverse extension is adjacent to the trench and is disposed on the second upper surface of the first dielectric layer;
the second transverse extension is disposed on the upper surface of the substrate;
the vertical extension is disposed on a sidewall of the first dielectric layer, a sidewall of the second nitride semiconductor layer and a sidewall of the first nitride semiconductor layer, and is connected to the first transverse extension and the second transverse extension.

18. The semiconductor device structure of claim 17, wherein the second transverse extension comprises a first end and a second end opposite to each other, the first end is connected to the vertical extension, a surface of the second end is coplanar with a side surface of the substrate and together serve as a cut surface formed by cutting, wherein the sidewall of the first dielectric layer, the sidewall of the second nitride semiconductor layer and the sidewall of the first nitride semiconductor layer are not part of the cut surface.

* * * * *